United States Patent
Norman et al.

(10) Patent No.: US 6,879,170 B2
(45) Date of Patent: Apr. 12, 2005

(54) FLEXIBLE CONNECTING DEVICE FOR INTERFACING WITH A WAFER

(75) Inventors: Richard Norman, Sutton (CA); David Chamberlain, Verdun (CA)

(73) Assignee: Richard S. Norman, Sutton (CA)

( * ) Notice: Subject to any disclaimer, the term of this patent is extended or adjusted under 35 U.S.C. 154(b) by 0 days.

(21) Appl. No.: 10/606,886

(22) Filed: Jun. 27, 2003

(65) Prior Publication Data

US 2004/0002236 A1 Jan. 1, 2004

Related U.S. Application Data

(60) Provisional application No. 60/391,610, filed on Jun. 27, 2002.

(51) Int. Cl.[7] ............................................. G01R 31/02
(52) U.S. Cl. ...................................................... 324/754
(58) Field of Search .............................. 324/754, 756, 324/757, 758, 761, 762, 760, 765, 158.1; 439/482

(56) References Cited

U.S. PATENT DOCUMENTS

| | | | |
|---|---|---|---|
| 5,042,148 A | | 8/1991 | Tada et al. |
| 5,629,630 A | | 5/1997 | Thompson et al. |
| 5,923,178 A | * | 7/1999 | Higgins et al. ............. 324/754 |
| 6,480,012 B1 | * | 11/2002 | Komori ....................... 324/754 |
| 6,525,551 B1 | * | 2/2003 | Beaman et al. ............. 324/754 |
| 6,621,710 B1 | * | 9/2003 | Cheng et al. ................ 361/774 |

* cited by examiner

*Primary Examiner*—David Zarneke
*Assistant Examiner*—Tung X. Nguyen

(57) ABSTRACT

The present invention provides a connecting device for connection to a body of semiconductor material. The body of semiconductor material includes an integrated circuit that contains a plurality of clusters of signal transmissive connector elements arranged in a predetermined disposition. The connecting device includes a plurality of groups of signal transmissive connector members for connection to an associated cluster of signal transmissive connector elements. The disposition of the signal transmissive connector members in each group matches the disposition of the signal transmissive connector elements in that group's associated cluster. The connecting device further includes flexible portions between its respective groups of signal transmissive connector members. The flexible portions have a flexibility that allows the groups of signal transmissive connector members to move in relation to each other when they are connected to respective clusters of signal transmissive connector elements on the surface of a body of semiconductor material. As such, each group of signal transmissive connector members is able to maintain a secure and undamaged connection with a respective cluster of signal transmissive connector elements as the body of semiconductor material expands and contracts under thermal effects.

31 Claims, 6 Drawing Sheets

FLEXIBLE CONNECTING DEVICE FOR INTERFACING WITH A WAFER

CROSS REFERENCE TO RELATED APPLICATIONS

This application claims priority from U.S. provisional Application having Ser. No. 60/391,610 filed Jun. 27, 2002, the contests of which are incorporated herein by reference.

FIELD OF THE INVENTION

The present invention provides a flexible connecting device for connecting to an integrated circuit located on a body of semiconductor material. More specifically the present invention provides a flexible connecting device that is able to adapt to the thermal expansion and contraction of a body of semiconductor material.

BACKGROUND OF THE INVENTION

In the past and to a certain extent still today, many integrated circuits are formed by etching a plurality of individual functional modules, or a group of a few interconnected functional modules onto the surface of a body of semiconductor material. Once the functional modules are formed onto the body of semiconductor material, each individual functional module, or the group of a few functional modules are cut out of the semiconductor material and are packaged as individual integrated circuits. Each integrated circuit comprises a cluster of signal transmissive connector elements that can be connected to external circuitry using a connecting device. Such integrated circuits occupy a small enough area of semiconductor material that the thermal expansion of the semiconductor material does not effect the connection between the signal transmissive connector elements and the connecting device.

Presently, integrated circuits are becoming increasingly large. A problem with such large integrated circuits is that they comprise more than one cluster of signal transmissive connector elements, and the separation between the clusters changes as the body of semiconductor material expands and contracts under thermal effects. Unfortunately, traditional connecting devices do not have the same coefficient of thermal expansion as the body of semiconductor material. Therefore, as the body of semiconductor material heats up, the expansion of the distance between the clusters of signal transmissive connector elements causes strain on the connections between the clusters of signal transmissive connector elements and the connecting device. Often, this strain is enough to damage and break the connection.

Therefore, there exists a need in the industry for a connecting device that is able to connect to the many clusters of signal transmissive connector elements positioned on a large integrated circuit and maintain a secure connection with these signal transmissive connector elements as the body of semiconductor material expands and contracts.

SUMMARY OF THE INVENTION

As embodied and broadly described herein, the present invention provides a connecting device for connecting to a body of semiconductor material that includes an integrated circuit. The body of semiconductor material further includes a planar surface with a plurality of clusters that have a plurality of signal transmissive connector elements arranged in a predetermined disposition. The connecting device carries a plurality of groups of signal transmissive connector members, wherein each group of signal transmissive connector members is associated with a respective cluster of signal transmissive connector elements. The signal transmissive connector members in each group are arranged according to the disposition of the signal transmissive connector elements in the cluster associated with that group, such that each signal transmissive connector member mates with a corresponding one of the signal transmissive connector elements. The connecting device further includes flexible portions between its respective groups of signal transmissive connector members, and each flexible portion includes a plurality of signal transmission pathways connecting to a respective signal transmissive connector member of a group of signal transmissive connector members. The flexible portions have a flexibility that allows the respective groups of signal transmissive connector members to move in relation to one another under the effect of thermal expansion of the body of semiconductor material.

The connecting device described above provides the advantage of having flexible portions located between its groups of signal transmissive connector members. These flexible portions allow the groups of signal transmissive connector members to move in relation to each other when they are connected to respective clusters of signal transmissive connector elements on the surface of a body of semiconductor material. As such, each group of signal transmissive connector members is able to maintain a secure and undamaged connection with a respective cluster of signal transmissive connector elements as the body of semiconductor material expands and contracts under thermal effects.

In a non-limiting example of implementation the body of semiconductor material is in the form of a silicon wafer.

As used herein, the term "integrated circuit" refers globally to the circuitry formed on the body of semiconductor material. The integrated circuit can consist of a plurality of interconnected functional modules, or alternatively the integrated circuit can consist of a single large functional module.

In one possible form of implementation, the signal transmissive connector elements are electrical connectors that are able to convey electrical signals. In a possible variant, the signal transmissive connector elements include optical connectors to convey optical signals. The signal transmissive connector elements are formed into a plurality of clusters that are located on the surface of the semiconductor material. The predetermined disposition of the signal transmissive connector elements within a cluster can be identical from cluster to cluster, or alternatively the disposition of the signal transmissive connector elements can be different within each cluster. The separation between each individual signal transmissive connector element is significantly less than the separation between individual clusters. Therefore, as the semiconductor material expands, the distance between each individual signal transmissive connector element changes insignificantly, whereas the distance between each cluster changes by an amount that can cause damage to a rigid connecting device that is secured to two different clusters.

In one possible form of implementation the groups of signal transmissive connector members on the connecting device are electrical connectors that are able to convey electrical signals. In a possible variant, the signal transmissive connector members are optical connectors for conveying optical signals. The predetermined disposition of the signal transmissive connector members in each group matches the disposition of the signal transmissive connector elements in a corresponding cluster. In this way, when a group of signal transmissive connector members is placed on top of its corresponding cluster of signal transmissive connector elements, each signal transmissive connector member will mate with a respective signal transmissive connector element.

The connecting device further includes signal transmission pathways that connect the signal transmissive connector members to outside circuitry. For the purpose of this specification, the signal transmissive pathways associated with a single group of signal transmissive connector members will be designated as a bundle. In a specific example of implementation, every bundle of signal transmissive pathways extends from the respective group of signal transmissive connector members to a base element that in turn connects all the bundles of signal transmission pathways to outside circuitry. The signal transmission pathways can be electrical pathways, or alternatively, they can include optical pathways.

The connecting device further includes flexible portions between each group of signal transmissive connector members that allow the groups of signal transmissive connector members to move in relation to each other. In a non-limiting example of implementation, the flexible portions can be in the form of a flexible printed circuit. The flexible printed circuit includes a flexible insulating membrane on which are formed by printing, one or more bundles of signal transmission pathways. The flexible portions have sufficient flexibility to allow the groups of signal transmissive connector members to move a distance that is in accordance with the thermal expansion and contraction of the body of semiconductor material.

Optionally, the connecting device can include an integrated circuit in the form of a signal-processing device that is able to perform signal processing on signals traveling through the connecting device.

Furthermore, the present invention provides in combination, a body of semiconductor material including an integrated circuit, and a connecting device as described above.

As further embodied and broadly described herein, the present invention provides a connecting device for a body of semiconductor material that includes an integrated circuit. The body of semiconductor material has a planar surface with a plurality of optical signal transmissive connector elements arranged in a predetermined disposition thereon. The connecting device comprises a plurality of optical signal transmissive connector members that are each associated with a respective optical signal transmissive connector element. The optical signal transmissive connector members are arranged according to the disposition of the optical signal transmissive connector elements such that each optical signal transmissive connector member can communicate optically with a corresponding one of the optical signal transmissive connector elements. The connecting device further includes flexible portions between respective optical signal transmissive connector members. Each flexible portion includes a signal transmission pathway that connects to an optical signal transmissive connector member. The flexible portions have a flexibility that allows respective optical signal transmissive connector members to move in a direction parallel to the planar surface in relation to one another under the effect of thermal expansion of the body of semiconductor material.

Furthermore, the present invention provides in combination, a body of semiconductor material including an integrated circuit, and a connecting device as described above.

BRIEF DESCRIPTION OF THE DRAWINGS

A detailed description of examples of implementation of the present invention is provided hereinbelow with reference to the following drawings, in which.

Figure 1:
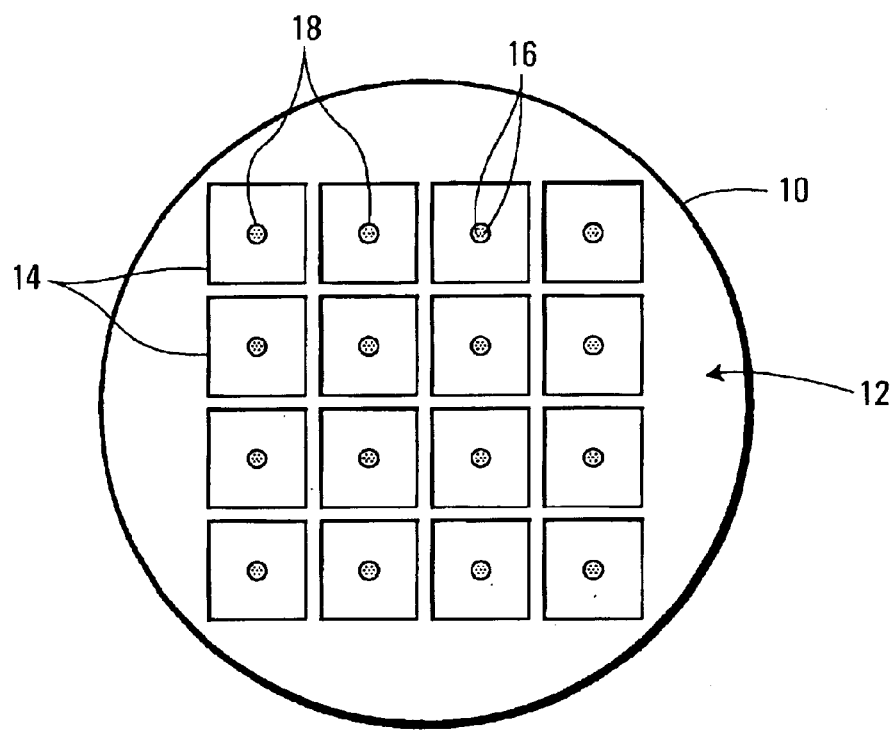
FIG. 1 is a top plan view of a semiconductor wafer.

In the drawings, embodiments of the invention are illustrated by way of example. It is to be expressly understood that the description and drawings are only for purposes of illustration and as an aid to understanding, and are not intended to be a definition of the limits of the invention.

DETAILED DESCRIPTION

FIG. 1 illustrates a body of semiconductor material in the form of a silicon wafer 10. Although wafer 10 is a perfect circle it should be expressly understood that for the purposes of the present invention any shape of semiconductor material could be used.

Wafer 10 includes an integrated circuit 12 with a planar surface that comprises a plurality of functional modules 14. The functional modules 14 may have identical or different architectures and are arranged into an array of rows and columns. Each functional module 14 includes a cluster 18 of signal transmissive connector elements 16. (Signal transmissive connector elements 16 are electrical connectors for conveying electrical signals. The signal transmissive connector elements 16 allow functional modules 14 to receive and/or transmit signals with external devices. Alternatively, signal transmissive connector elements 16 include optical connectors for conveying optical signals. The separation between individual signal transmissive connector elements 16 within a cluster 18 is significantly less than the distance between individual clusters 18. Therefore, as the semiconductor material expands, the distance between each signal transmissive connector element 16 changes insignificantly, whereas the distance between each cluster 18 changes by an amount that can cause damage to a rigid connecting device that is secured to two different clusters 18.

Figure 2:
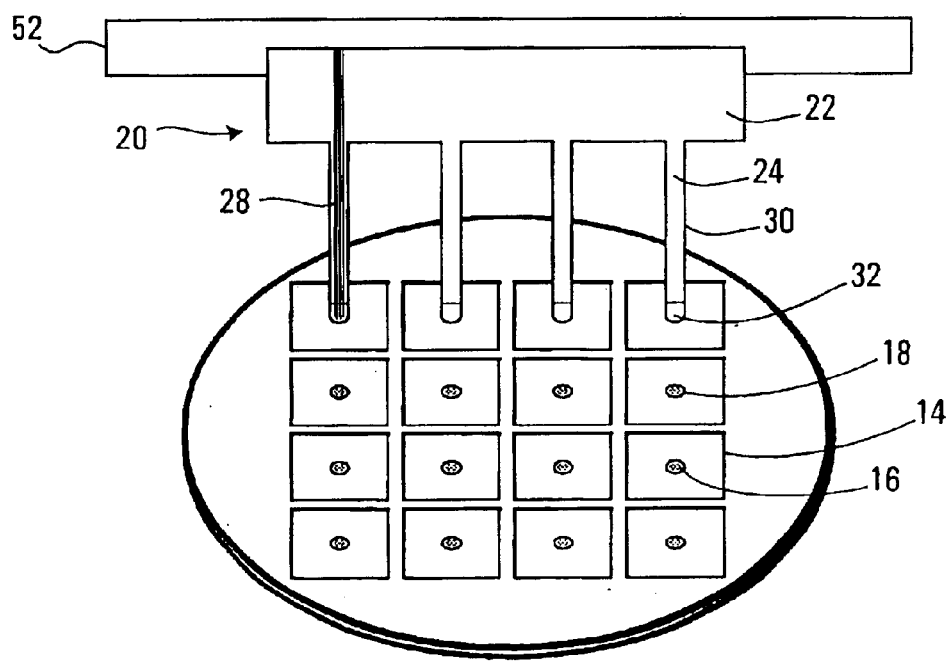
FIG. 2 is a top perspective view of a connecting device according to the first embodiment of the present invention connected to the semiconductor wafer shown in FIG. 1.

FIG. 2 shows a connecting device 20 in accordance with a first embodiment of the present invention connected to semiconductor wafer 10. Connecting device 20 is adapted to connect the signal transmissive connector elements 16 located on wafer 10 to external devices such as terminal block 52, that in turn connects integrated circuit 12 to external circuitry (not shown). Connecting device 20 includes a base element 22 and a series of fingers 24. Each finger 24 comprises a finger body 30 and a fingertip 32. In the embodiment shown in FIG. 2, connecting device 20 includes a row of fingers 24 connected to a row of clusters 18, where each cluster 18 belongs to a respective functional module 14 in a row of functional modules.

Figure 3:
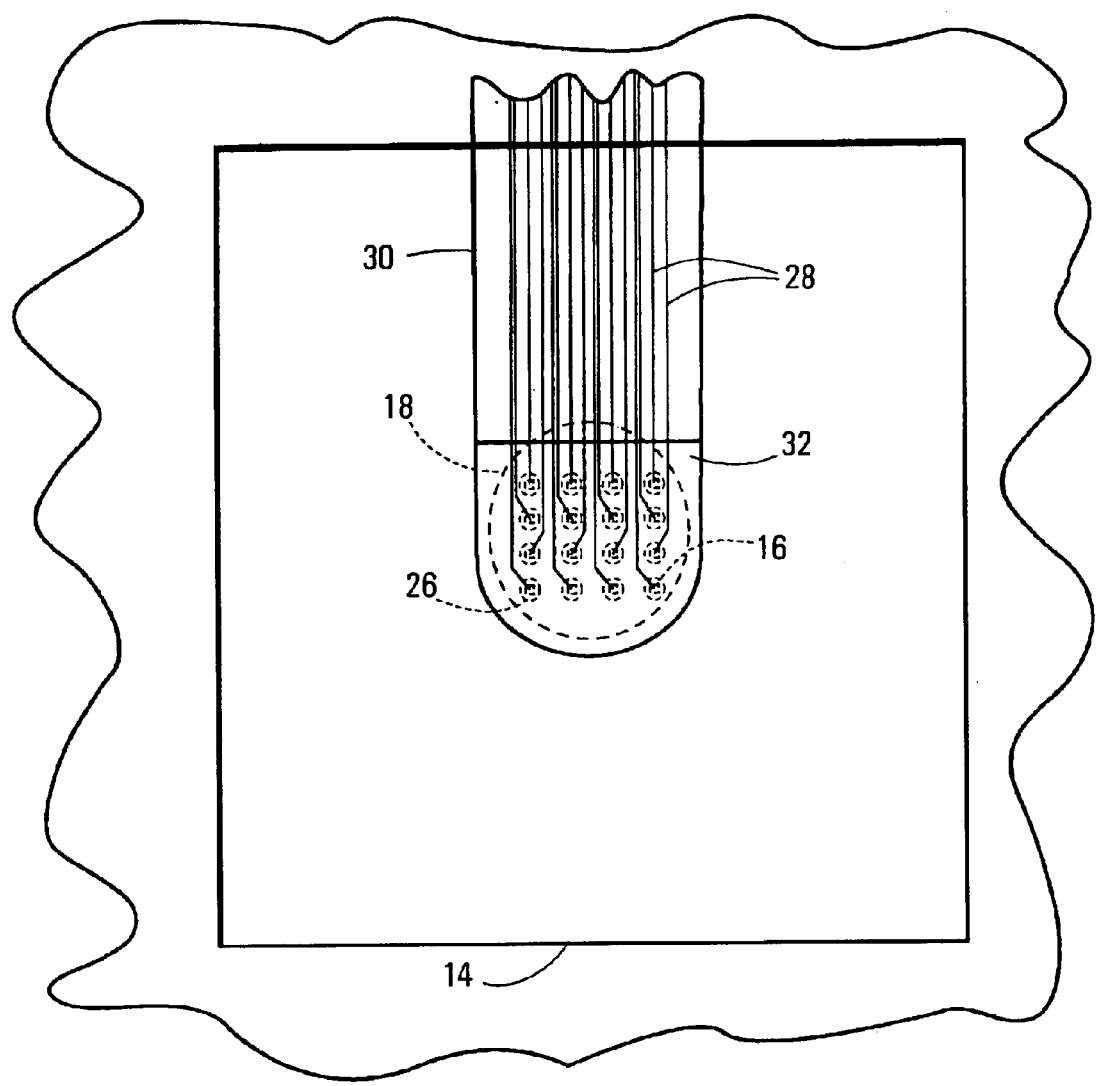
FIG. 3 is an enlarged view of a finger of the connecting device of FIG. 2, connected to a functional module of the wafer shown in FIG. 1.

FIG. 3 is an expanded view of, fingertip 32 connected to a cluster 18 located within functional module 14. Although only one fingertip 32 is shown in FIG. 3, each fingertip 32 includes a group of signal transmissive connector members 26 for connection to signal transmissive connector elements 16 within cluster 18. Although signal transmissive connector elements 16 are shown arranged into a predetermined disposition of rows and columns, it should be expressly understood that any disposition is possible, and that the disposition of signal transmissive connector elements 16 can be the same or different for each cluster 18. Furthermore, although FIG. 3 shows 16 signal transmissive connector elements 16 within cluster 18 it is possible for cluster 18 to contain any number of signal transmissive connector elements 16.

As mentioned above, fingertip 32 comprises a group of signal transmissive connector members 26. Signal transmissive connector members 26 are arranged into a disposition that matches the disposition of the signal transmissive connector elements 16 in an associated cluster 18. In this manner, when fingertip 32 is placed over a corresponding cluster 18 of signal transmissive connector elements 16, the signal transmissive connector members 26 mate with their respective signal transmissive connector elements 16.

In order to connect connecting device 20 to a row of clusters, each finger 24 is placed over, and aligned with a corresponding cluster 18, such that the signal transmissive connector members 26 mate with the signal transmissive connector elements 16. The connection is then made permanent. Some non-limiting examples of connection methods include electrically conductive adhesive and soldering. Alternatively, the fingertips may be releasably connected to wafer 10 using a mechanical clamp. Mechanical clamps are able to apply enough force on fingertips 32 to prevent them from moving without damaging either the signal transmissive connector elements 16 or the signal transmissive connector members 26. Mechanical clamps also have the advantage that they can act as heat sinks to dissipate some of the heat generated by the integrated circuit.

Once connected, signal transmissive connector elements 16 and signal transmissive connector members 26 are able to exchange electrical signals. Alternatively, optical signals may be exchanged if the appropriate connectors are used, as previously envisaged.

As can be seen in both FIGS. 2 and 3, connecting device 20 includes a bundle of signal conductive pathways 28 that allow signals to travel between signal transmissive connector members 26 and terminal block 52. Each group of signal transmissive connector members 28 is associated to a bundle of signal transmission pathways 28. Signal transmission pathways 28 are adapted to transmit electrical signals and possibly optical signals between signal transmissive connector members 26 and terminal block 52.

Fingers 24 of connecting device 20 constitute flexible portions that allow relative movement between fingertips 32 in order to compensate for thermal expansion and contraction of wafer 10 to which they are connected. Each finger 24 is a flexible printed circuit. Methods of manufacturing flexible printed circuits are well known in the art and therefore will not be discussed further herein. For example, the printed circuit is made of an electrically insulating material such as Kapton® onto which are formed, by printing techniques, a bundle of copper signal transmission pathways 28. When the bundle of signal transmissive pathways includes optical pathways, such as optical fibers, the optical pathways can be integrated into the flexible printed circuit using known techniques.

Figure 4:
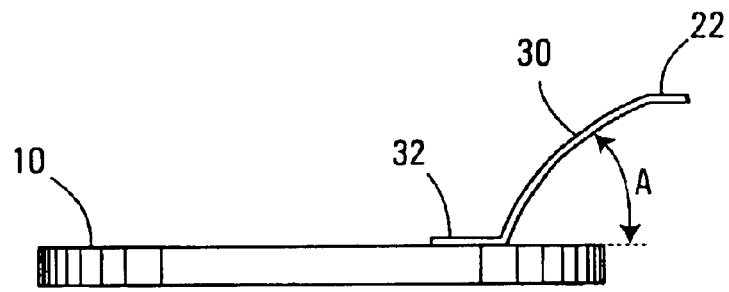
FIG. 4 is a side elevation of the connecting device shown in FIG. 2.

FIG. 4 is a side view of fingertips 32 connected to wafer 10. Once fingertips 32 are connected to wafer 10 all fingertips 32 lie in the same plane on the surface of the wafer 10. As such, all groups of signal transmissive connector members 26 are coplanar. Furthermore, fingertips 32 are positioned at an angle A of less than 90 degrees with respect to finger bodies 30. This allows many connecting devices 20 to be placed on wafer 10 in the arrangement shown in FIG. 5.

Figure 5:
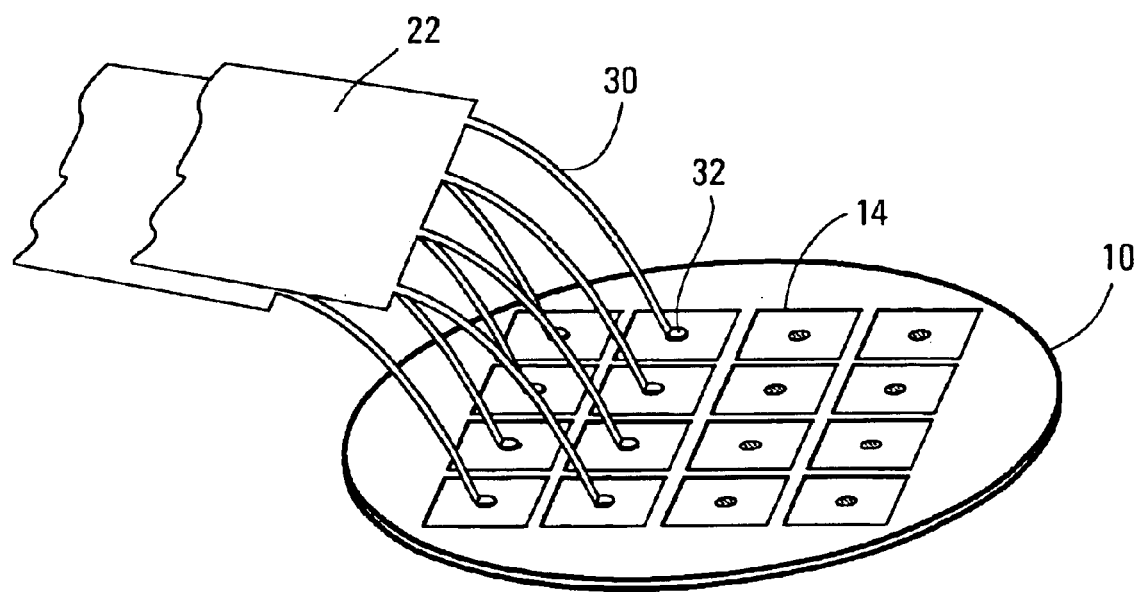
FIG. 5 is a perspective view of two connecting devices shown in FIG. 2 connected to different rows of functional modules on the semiconductor wafer.

FIG. 5 shows more than one connecting device connected to wafer 10. In order to provide connectivity for all the clusters 18 positioned on wafer 10, more than one connecting device 20 is used. Each connecting device 20 comprises enough fingers 24 to connect an entire row of functional modules 14. Therefore, in order to connect all clusters 18 contained on wafer 10, a number of connecting devices 20 are placed in front of one another until all clusters 18 are connected. Although FIG. 5 specifies that fingers 24 of connecting device 20 are positioned in a row, fingers 24 can be in any configuration that corresponds to the positioning of clusters 18 on wafer 10.

In use, as wafer 10 heats up and expands according to its coefficient of thermal expansion, the separation between clusters 18 increases. Since the finger bodies 30 of connecting device 20 are flexible, fingertips 32 are able to move in a direction parallel to the planar surface of wafer 10 in relation to other fingertips 32 as the distance between clusters 18 expands. As such, fingertips 32 are able to follow the individual movement of each cluster 18. This enables fingertips 32 to maintain a secure connection with signal transmissive connection elements 16 as wafer 10 experiences thermal expansion and contraction.

Figure 6:
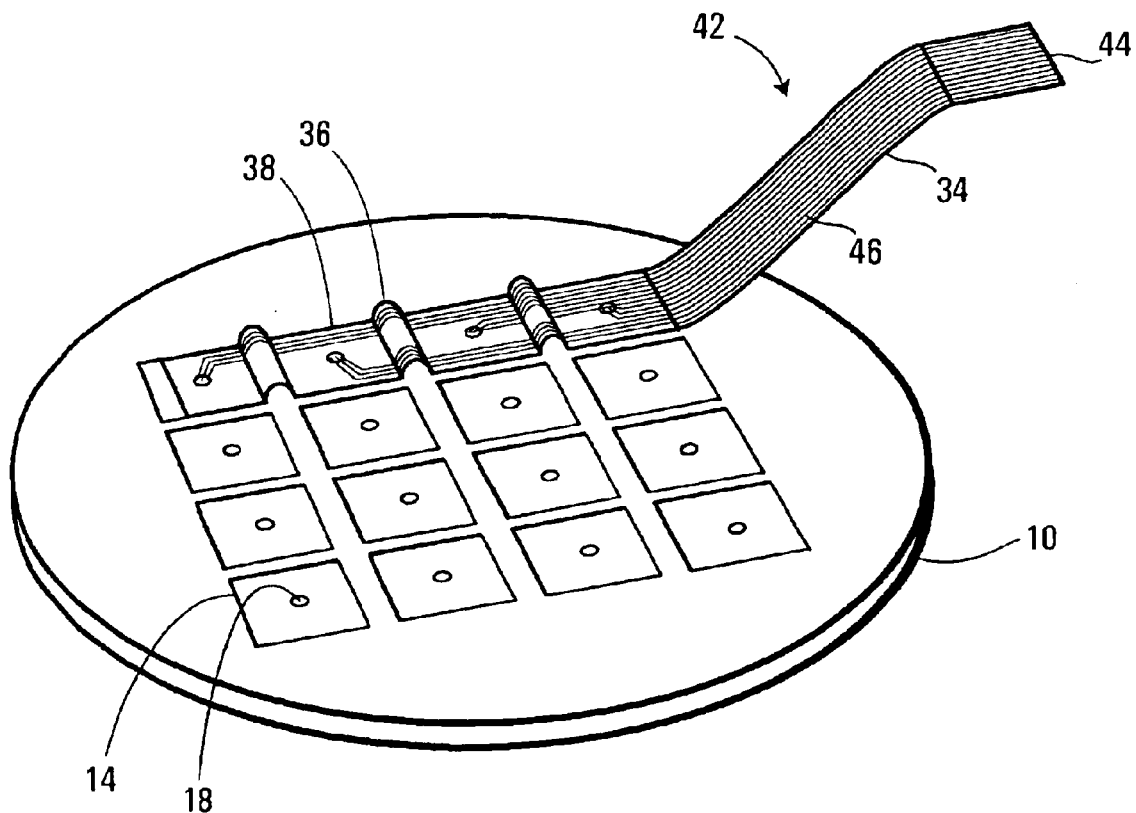
FIG. 6 is a perspective view of a connecting device according to a second embodiment of the present invention.

FIG. 6 is a top perspective view of a connecting device 42 in accordance with a second embodiment of the present invention. Connecting device 42 includes a base element 44, and a long flexible band 34. Situated on band 34 are connector zones 38 and bowed flexible portions 36 that join connector zones 38.

Each connector zone 38 includes a group of signal transmissive connector members (not shown) for connecting to a corresponding cluster 18 of signal transmissive connector elements 16 on the surface of wafer 10. As discussed earlier in connection with the first embodiment the signal transmissive connector members within each group are arranged in a predetermined disposition that matches the disposition of the signal transmissive connector elements 16 in corresponding clusters 18. In this manner, when the connector zones 38 are placed over corresponding functional modules in a row of functional modules, the signal transmissive connector members in each group mate with their respective signal transmissive connector elements 16 in a corresponding cluster 18.

As can be seen in FIG. 6, connecting device 42 includes bundles of signal transmission pathways 46. Bundles of signal transmission pathways 46 transmit electrical signals and possibly optical signals between signal transmissive connector members and outside circuitry (not shown). As seen in FIG. 6, a bundle of signal transmission pathways 46 extends from each group of signal transmissive connector members through band 34 to the end of base element 44, which is able to connect to outside circuit (not shown).

Band 34 of connecting device 42 is in the form of a flexible printed circuit as discussed earlier in connection with the first embodiment. When the signal transmissive pathways include optical pathways, such as optical fibers, they can be integrated in the flexible circuit by using known techniques.

Figure 7:
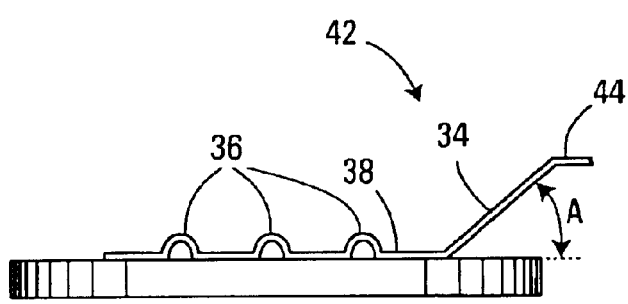
FIG. 7 is a side view of the connecting device shown in FIG. 6.

As can be seen in FIG. 7, connector zones 38 are connected to each other by flexible portions 36. In the embodiment shown, flexible portions 36 are parts of the flexible printed circuit of band 34 that are shaped into arches. The arch between each connector zone 38 allows connector zones 38 to move in relation to one another as wafer 10 expands and contracts. Alternatively, flexible portions 36 may be in the shape of an accordion. It is within the scope of the invention for flexible portions 36 to be in any shape that permits the movement of connector zones 38 in relation to each other. Each bundle of signal transmission pathways 46 is able to extend through flexible portions 36 thereby allowing signals to pass from all connector zones 38 to base element 44.

In order to connect connecting device 42 to a row or column of clusters 18, band 34 is placed over, and aligned with the clusters such that the signal transmissive connector members in each connector zone 38 mate with respective signal transmissive connector elements 16. Once connector zones 38 of band 34 are in place, the connection is made permanent. Some non-limiting examples of connection methods include electrically conductive adhesive and soldering. Alternatively, band 34 may be releasably connected to wafer 10 using a mechanical clamp. Mechanical clamps are able to apply enough force on connector zones 38 to prevent band 34 from moving, without damaging either the signal transmissive connector elements 16 or the signal transmissive connector members. Mechanical clamps also have the advantage that they can act as heat sinks to dissipate some of the heat generated by the integrated circuit.

Once connected the signal transmissive connector members are able to exchange electrical signals with signal transmissive connector elements 16. Alternatively, optical signals may be exchanged if the appropriate connectors are used. Furthermore, once connector zones 38 are connected to wafer 10 all the signal transmissive connector members within a connector zone 38 lie in the same plane on the surface of wafer 10. As such, the signal transmissive connector members are all coplanar. Furthermore, band 34 is positioned at an angle A of less than 90 degrees with respect to wafer 10.

In use, as the wafer 10 heats up and expands according to its coefficient of thermal expansion, the separation between clusters 18 increases. Since band 34 includes flexible regions 36 between each connector zone 38, the connection zones 38 are able to move in relation to each other. This means that connection zones 38 are able to follow the individual movement of each cluster 18. As such, the groups of signal transmissive connector members within each connector zone 38 are able to maintain a secure connection with signal transmissive connection elements 16 as wafer 10 experiences thermal expansion and contraction.

Figure 8:
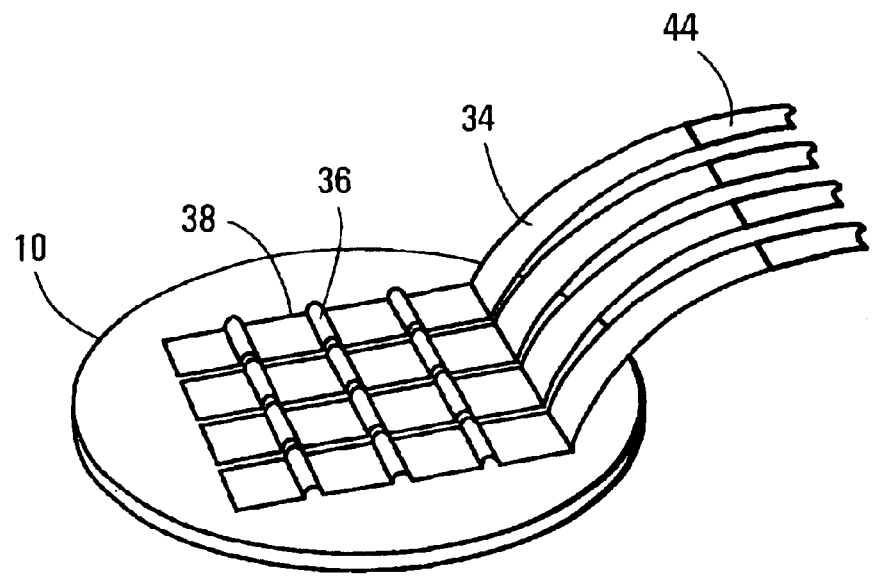
FIG. 8 is a perspective view of four connecting devices according to the second embodiment of the present invention shown in FIG. 6, where each connecting device is connected to a different row of functional modules of the semiconductor wafer.

FIG. 8 shows more than one connecting device connected to wafer 10. In order to provide connectivity for all clusters 18 positioned on wafer 10, more than one connecting device 42 is used. Each connecting device 42 comprises a band 34 with enough connecting zones 38 to connect an entire row or column of functional modules. Alternatively, connecting zones 38 can be configured into an array that covers functional modules in both rows and columns. In order to connect all clusters 18 contained on wafer 10, a number of connecting devices 42 are placed next to each other until all clusters 18 are connected. Although FIG. 8 specifies that bands 34 are positioned in a row, bands 34 can be in any configuration that corresponds to the positioning of the clusters 18 on wafer 10.

Figure 9:
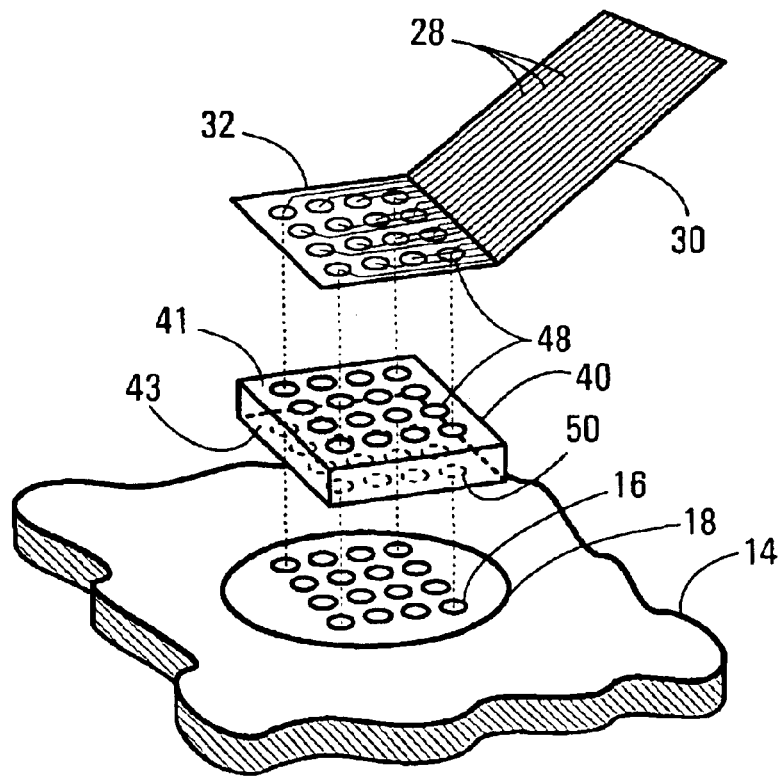
FIG. 9 is an exploded view of a variant of the connecting device shown in FIG. 2 that includes a signal-processing device.

FIG. 9 is an exploded view of a variant of connecting device 20 according to the first embodiment of the present invention. Positioned on fingertip 32 of connecting device 20 is a signal-processing element implemented by an integrated circuit 40. Integrated circuit 40 is formed on a semiconductor chip. Although in the specific embodiment shown, integrated circuit 40 is positioned at the end of fingertip 32, integrated circuit 40 can be positioned on or within any part of either connecting device 20, or connecting device 42 according to the second embodiment of the present invention.

In the embodiment shown, integrated circuit 40 includes a top surface 41 and a bottom surface 43. Fingertip 32 and top surface 41 of integrated circuit 40 include a series of interconnects 48 that connect integrated circuit 40 to a bundle of signal transmission pathways 28. Interconnects 48 enable integrated circuit 40 to receive and transmit signals from signal transmission pathways 28.

Located on bottom surface 43 of integrated circuit 40 is a group of signal transmissive connector members 50. Signal transmissive connector members 50 are arranged into a disposition that matches the disposition of the signal transmissive connector elements 16 in associated cluster 18. In this manner, when fingertip 32 is placed over cluster 18, the signal transmissive connector members 50 mate with respective signal transmissive connector elements 16. Once connected, signal transmissive connector elements 16 and signal transmissive connector members 50 are able to exchange electrical signals. Alternatively, optical signals may be exchanged if the appropriate connectors are used, as previously envisaged.

Integrated circuit 40 can be any sort of signal processing device. Some non-limiting examples include amplifiers or signal transducers such as optical-electrical or electrical-optical signal transducers.

Therefore, integrated circuit 40 is able to receive signals from signal transmissive connector elements 16 and process those signals before sending them through signal transmission pathways 28 to outside circuitry. Alternatively, integrated circuit 40 is able to receive a signal from a signal transmission pathway 28 and process that signal before transmitting it to a signal transmissive connector element 16 of integrated circuit 12.

Figure 10:
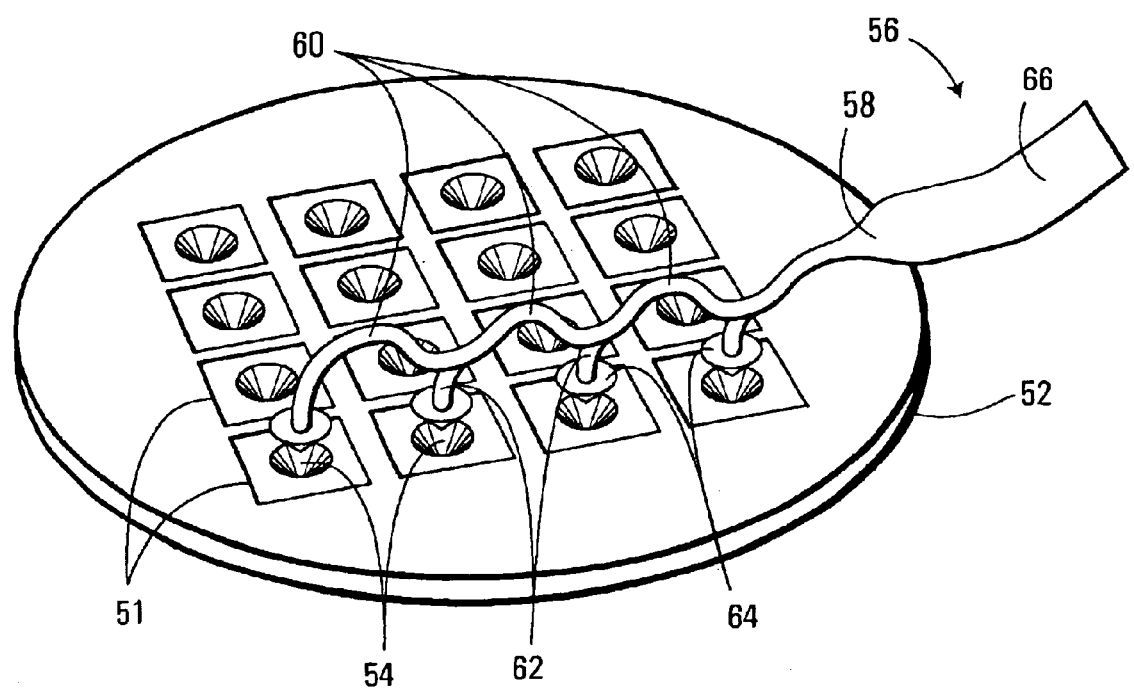
FIG. 10 is a perspective view of an unconnected connecting device in accordance with a third embodiment of the present invention.

FIG. 10 illustrates a connecting device 56 in accordance with a third embodiment of the present invention, positioned above a wafer 52. Wafer 52 includes a planar surface with a plurality of functional modules 51 positioned thereon. Each functional module 51 includes an optical signal transmissive connector element 54 that is capable of transmitting and receiving optical signals. In the specific embodiment shown, optical signal transmissive connector elements 54 are shaped as conical recesses that extend into the surface of wafer 52. Each functional module 51 includes circuitry such as a wavelength filter and a wavelength converter, and an optical/electric converter for converting optical signals to electrical signals and vice versa. Circuitry for converting optical signals to electrical signals is known in the art, and will not be discussed in more detail herein. It should be understood that as wafer 52 expands and contracts under thermal effects, the distance between each optical signal transmissive connector element 54 changes by an amount that can cause damage to a rigid connecting device that is secured to two different optical signal transmissive connector elements 54.

Connecting device 56 includes a band of material 58, such as optical fiber, capable of carrying optical signals. Band 58 further includes flexible regions 60 and branches 62. The branches 62 are split from band 58 using optical taps or any other device, or technique, known in the art. At the tip of each branch 62 is an optical signal transmissive connector member 64. The optical signal transmissive connector members 64 are shaped so as to complement the shape of the optical signal transmissive connector elements 54. As such, in the specific example illustrated, optical signal transmissive connector members 64 are cone shaped so as to be able to fit within the conical recesses of optical signal transmissive connector elements 54. The optical signal transmissive connector members 64 are arranged on band 58 in order to correspond with a respective optical signal transmissive connector element 54 on wafer 52. For clarity, FIG. 10 shows connecting device 56 and wafer 52 unconnected; however, when the two are connected the optical signal transmissive connector members 54 and the optical signal transmissive connector elements are able to communicate optically in order to exchange optical signals.

Flexible regions 60 allow relative movement between individual optical signal transmissive connector members 64 in order to compensate for the thermal expansion and contraction of wafer 52 to which they are connected. More specifically, the flexible regions 60 of band 58 enable the optical signal transmissive connector members 64 to move in a direction parallel to the planar surface of wafer 52 in relation to other optical signal transmissive connector members 64 as the distance between optical signal transmissive connector elements 54 expands. In the embodiment shown, the flexible regions are formed by arching the fiber optic material between consecutive optical signal transmissive connector members 64. Alternatively, the flexible regions may be created as a result of the elasticity of the material connecting the consecutive optical signal transmissive connector members 64.

It should be appreciated that signals may be transmitted and received between the optical signal transmissive connector members 64 and the optical signal transmissive connector elements 54, over different wavelengths. As such, each optical signal transmissive connector member 64 is of sufficient optical bandwidth to allow the exchange of a plurality of optical signals at different wavelengths. These different wavelengths allow signals to travel between signal transmissive connector members 64 and a terminal block (not shown) that is connected to the terminal end 66 of band 58.

Although various embodiments have been illustrated, this was for the purpose of describing, but not limiting, the invention. Various modifications will become apparent to those skilled in the art and are within the scope of this invention, which is defined more particularly by the attached claims.

What is claimed is:

1. A connecting device for a body of semiconductor material including an integrated circuit, the body of semiconductor material including a planar surface with a plurality of clusters, each cluster having a plurality of signal transmissive connector elements arranged on the planar surface in a predetermined disposition, said connecting device comprising:
   a) a plurality of groups of signal transmissive connector members
      i) each group of signal transmissive connector members being associated with a respective cluster of signal transmissive connector elements,
      ii) the signal transmissive connector members in each group being arranged according to the disposition of the signal transmissive connector elements in the cluster associated with the group such that each signal transmissive connector member can mate with a corresponding one of the signal transmissive connector element,
   b) flexible portions between respective groups of signal transmissive connector members;
   c) each flexible portion including a plurality of signal transmission pathways connecting to respective signal transmissive connector members of a group of signal transmissive connector members;
   d) the flexible portions having a flexibility allowing the respective groups of signal transmissive connector members to move in a direction parallel to said planar surface with relation to one another under the effect of thermal expansion of the body of semiconductor material.

2. A connecting device as defined in claim 1, wherein said connecting device includes a base element and a plurality of projecting fingers, each finger carrying a respective group of signal transmissive connector members.

3. A connecting device as defined in claim 2, wherein each finger includes a flexible portion.

4. A connecting device as defined in claim 3, wherein said finger is a flexible printed circuit.

5. A connecting device as defined in claim 1, wherein said connecting device comprises an elongated band, said band including a plurality of connector zones in a spaced apart relationship separated from one another by said flexible portions.

6. A connecting device as defined in claim 5, wherein each connector zone includes a group of signal transmissive connector members.

7. A connecting device as defined in claim 6, wherein said elongated band is a flexible printed circuit.

8. A connecting device as defined in claim 1, wherein said connecting device includes a signal-processing element including an integrated circuit formed on a semiconductor chip.

9. A connecting device as defined in claim 8, wherein at least one group of signal transmissive connector members are realized on said semiconductor chip.

10. In combination:
   a) a body of semiconductor material including an integrated circuit, the body of semiconductor material including:
      i) a planar surface with a plurality of clusters, each cluster having a plurality of signal transmissive connector elements arranged on said planar surface in a predetermined disposition;
   b) a connecting device, comprising:
      i) a plurality of groups of signal transmissive connector members
         I) each group of signal transmissive connector members being associated with a respective cluster of signal transmissive connector elements,
         II) the signal transmissive connector members in each group being arranged according to the disposition of the signal transmissive connector elements in the cluster associated with the group such that each signal transmissive connector member mates with a corresponding one of the signal transmissive connector element,
      ii) flexible portions between respective groups of signal transmissive connector members;
      iii) each flexible portion including a plurality of signal transmission pathways connecting to respective signal transmissive connector members of a group of signal transmissive connector members;

iv) the flexible portions having a flexibility allowing the respective groups of signal transmissive connector members to move in a direction parallel to said planar surface with relation to one another under the effect of thermal expansion of the body of semiconductor material.

11. A combination as defined in claim 10, wherein said groups of signal transmissive connector members are coplanar.

12. A combination as defined in claim 11, wherein said connecting device includes a base element and a plurality of projecting fingers, each finger carrying a respective group of signal transmissive connector members.

13. A combination as defined in claim 12, wherein each finger includes a flexible portion.

14. A combination as defined in claim 13, wherein each finger is a flexible printed circuit.

15. A combination as defined in claim 14, including a plurality of said connecting devices connected to said body of semiconductor material.

16. A combination as defined in claim 14, wherein said integrated circuit includes a plurality of functional modules, wherein each cluster of signal transmissive connector elements belongs to a different functional module.

17. A combination as defined in claim 16, wherein said functional modules are arranged on said body of semiconductor material in an array including rows and columns.

18. A combination as defined in claim 17, wherein said connecting device connects with clusters of signal transmissive connector elements of functional modules in a single row of said array.

19. A combination as defined in claim 18, including a plurality of said connecting devices wherein each connecting device connects with clusters of signal transmissive connector elements of functional modules in a different row of said array.

20. A combination as defined in claim 11, wherein said connecting device comprises a plurality of connector zones in a spaced apart relationship connected by flexible portions.

21. A combination as defined in claim 20, wherein each connector zone includes a group of signal transmissive connector members.

22. A combination as defined in claim 21, wherein said flexible portion is a flexible printed circuit.

23. A combination as defined in claim 22, including a plurality of said connecting devices connected to said body of semiconductor material.

24. A combination as defined in claim 22, wherein said integrated circuit includes a plurality of functional modules, wherein each cluster of signal transmissive connector elements belongs to a different functional module.

25. A combination as defined in claim 24, wherein said functional modules are arranged on said body of semiconductor material in an array including rows and columns.

26. A combination as defined in claim 25, wherein said connecting device connects with clusters of signal transmissive connector elements of functional modules in a single row of said array.

27. A combination as defined in claim 26, including a plurality of said connecting devices wherein each connecting device connects with clusters of signal transmissive connector elements of functional modules in a different row of said array.

28. A combination as defined in claim 10, wherein said connecting device includes a signal processing element implemented by an integrated circuit formed on a semiconductor chip.

29. A combination as defined in claim 28, wherein said groups of signal transmissive connector members are realized on said integrated circuit formed on a semiconductor chip.

30. A connecting device for a body of semiconductor material including an integrated circuit, the body of semiconductor material including a planar surface having a plurality of optical signal transmissive connector elements arranged on the planar surface in a predetermined disposition, said connecting device comprising:

a) a plurality of optical signal transmissive connector members
  i) each optical signal transmissive connector member being associated with a respective optical signal transmissive connector element,
  ii) the optical signal transmissive connector members being arranged according to the disposition of the optical signal transmissive connector elements such that each optical signal transmissive connector member can communicate optically with a corresponding one of the optical signal transmissive connector elements,
b) flexible portions between respective optical signal transmissive connector members;
c) each flexible portion including a signal transmission pathway connecting to an optical signal transmissive connector member;
d) the flexible portions having a flexibility allowing respective optical signal transmissive connector members to move in a direction parallel to said planar surface with relation to one another under the effect of thermal expansion of the body of semiconductor material.

31. In combination:

a) a body of semiconductor material including an integrated circuit, the body of semiconductor material including:
  i) a planar surface with a plurality of optical signal transmissive connector elements arranged on said planar surface in a predetermined disposition;
b) a connecting device, comprising:
  i) a plurality of optical signal transmissive connector members
    I) each optical signal transmissive connector member being associated with a respective optical signal transmissive connector element,
    II) the optical signal transmissive connector members being arranged according to the disposition of the optical signal transmissive connector elements such that each optical signal transmissive connector member communicates optically with a corresponding one of the optical signal transmissive connector elements,
  ii) flexible portions between respective optical signal transmissive connector members;
  iii) each flexible portion including a signal transmission pathway connecting to the optical signal transmissive connector member;
  iv) the flexible portions having a flexibility allowing the optical signal transmissive connector members to move in a direction parallel to said planar surface with relation to one another under the effect of thermal expansion of the body of semiconductor material.

* * * * *